United States Patent
Hu et al.

(10) Patent No.: US 6,849,541 B1
(45) Date of Patent: Feb. 1, 2005

(54) METHOD OF FABRICATING A DUAL DAMASCENE COPPER WIRE

(75) Inventors: Shao-Chung Hu, Taipei (TW); Yu-Ru Yang, I-Lan Hsien (TW); Chien-Chung Huang, Tai-Chung Hsien (TW); Tzung-Yu Hung, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/707,517

(22) Filed: Dec. 19, 2003

(51) Int. Cl.⁷ .................. H01L 21/4763; H01L 21/44
(52) U.S. Cl. .............. 438/638; 438/643; 438/648; 438/653; 438/656; 438/672; 438/685; 438/687; 438/688
(58) Field of Search ................. 438/638, 643, 438/648, 653, 656, 687, 688

(56) References Cited

U.S. PATENT DOCUMENTS

2001/0041250 A1 * 11/2001 Werkhoven et al. ........ 428/212
2001/0054769 A1 * 12/2001 Raaijmakers et al. ....... 257/758
2003/0205825 A1 * 11/2003 Fujisawa et al. ............ 257/774
2004/0018722 A1 *  1/2004 Tarumi et al. .............. 438/638
2004/0026119 A1 *  2/2004 Chen .......................... 174/200

* cited by examiner

Primary Examiner—Amir Zarabian
Assistant Examiner—Toniae M. Thomas
(74) Attorney, Agent, or Firm—Winston Hsu (57) ABSTRACT

A method of forming at least one wire on a substrate. The substrate includes at least one conductive region. An insulating layer is disposed on the substrate. At least one recess in the insulating layer exposes the conductive region. A barrier layer is formed on a surface of the insulating layer and the recess first. A continuous and uniform conductive layer is then formed on a surface of the barrier layer. A seed layer is thereafter formed on a surface of the conductive layer. Finally, a metal layer filling up the recess is formed on a surface of the seed layer.

19 Claims, 15 Drawing Sheets

METHOD OF FABRICATING A DUAL DAMASCENE COPPER WIRE

BACKGROUND OF INVENTION

1. Field of the Invention

The present invention relates to a method of forming a dual damascene copper (Cu) wire, and more particularly, to a method of forming a dual damascene copper wire having superior Cu gap-filling ability and an enlarged process window.

2. Description of the Prior Art

A dual damascene process is a method of forming a conductive wire coupled with a via plug in a dielectric layer. The dual damascene structure, comprising a trench and a via hole, is used to connect devices and wires in a semiconductor wafer within various layers and is isolated from other devices by the inter-layer dielectrics (ILD) around it. Since the resistivity of copper is smaller than the resistivity of aluminum (Al), a large current can be sustained in a small area. Consequently, chips having high speed, high integration, and high efficiency (with 30–40% improvement) are fabricated. To fill copper into the dual damascene structures thus becomes a trend in fabricating dual damascene copper wires. As integrated circuit technology advances, improving the yield of the dual damascene structure, simplifying the process flow and reducing the production cost are important issues in the manufacturing process of integrated circuits at the present time.

Figure 1:
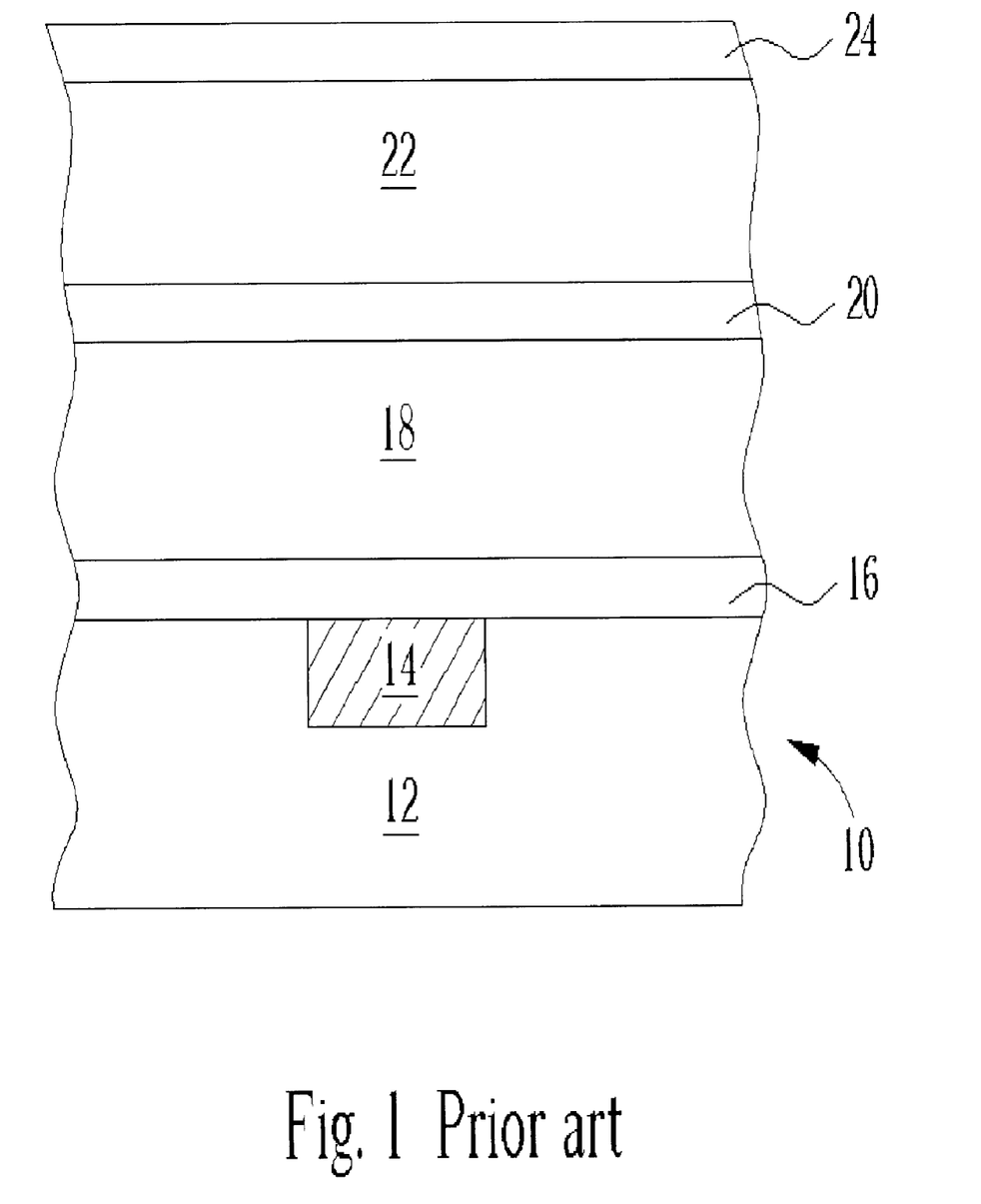
FIG. 1 to FIG. 7 are schematic diagrams of a prior art method of fabricating a dual damascene structure.

Please refer to FIG. 1 to FIG. 7. FIG. 1 to FIG. 7 are schematic diagrams of a method of fabricating a dual damascene copper wire according to the prior art. As shown in FIG. 1, a semiconductor wafer 10 comprises a substrate 12, a conducting layer 14 disposed on a predetermined region of a surface of the substrate 12, and a passivation layer 16 composed of silicon nitride disposed on a surface of the conducting layer 14. Since the other elements disposed on the surface of the substrate 12 are not the concerning parts in the dual damascene process, they are not shown in FIG. 1 and in other figures. Furthermore, the semiconductor wafer 10 comprises a low-k layer 18, a passivation layer 20, a low-k layer 22, and a hard mask layer 24 sequentially disposed on a surface of the passivation layer 16.

The low-k layers 18 and 22 are normally formed of spin-on-coating (SOC) low-k materials, such as HSQ or FLARE™. Since many of the low-k materials (especially the organic low-k materials) are fragile, denser materials, such as silicon nitride, are chosen to form the passivation layer 20 on the low-k layer 18 to harden the low-k layer 18. Similarly, another passivation layer is required to cover the low-k layer 22. The hard mask layer 24 covering the low-k layer 22 functions not only as the passivation layer but also as a hard mask in subsequent etching processes. The hard mask layer 24 is composed of silicon nitride or silicon oxy-nitride.

Figure 2:
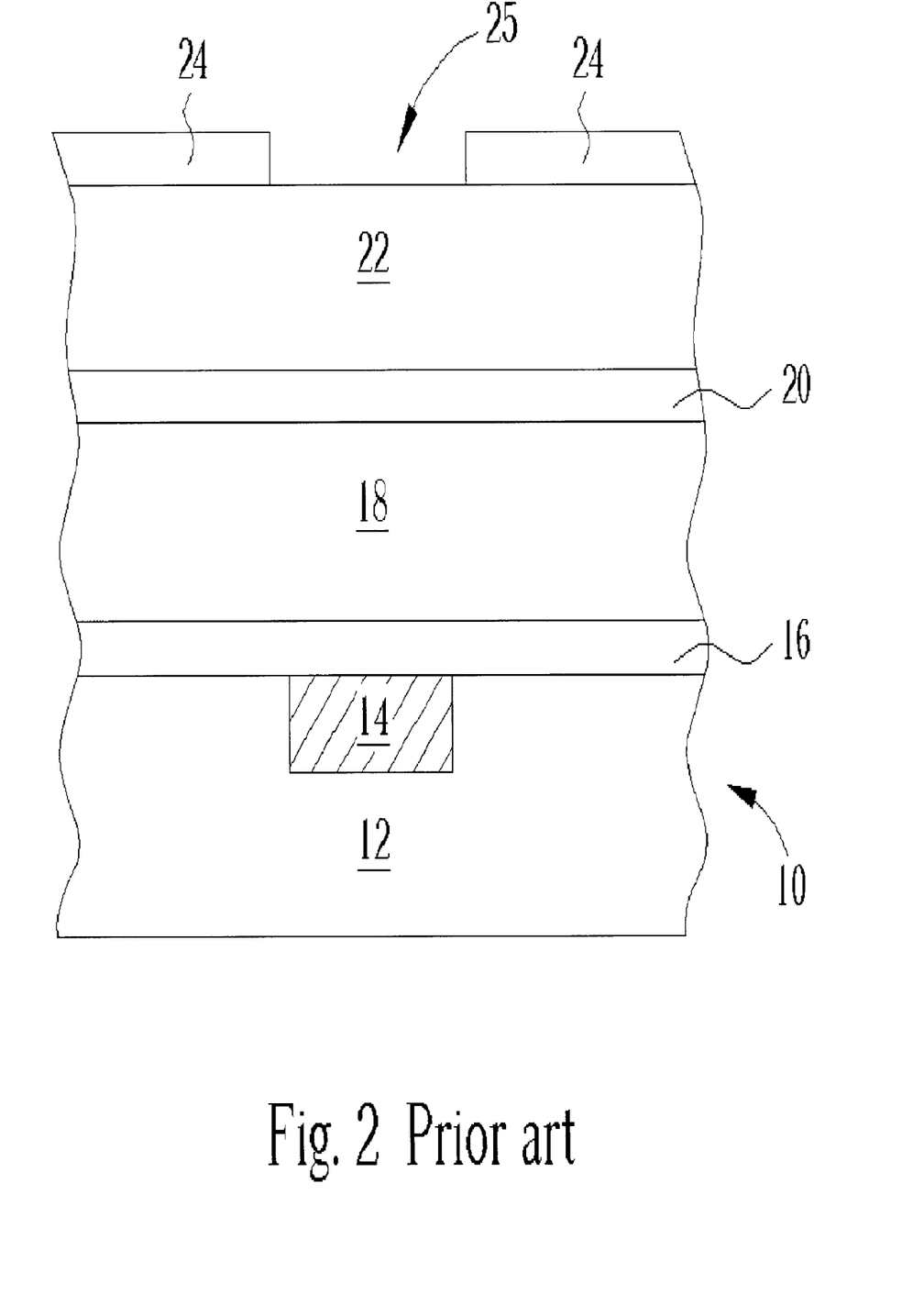
Figure 3:
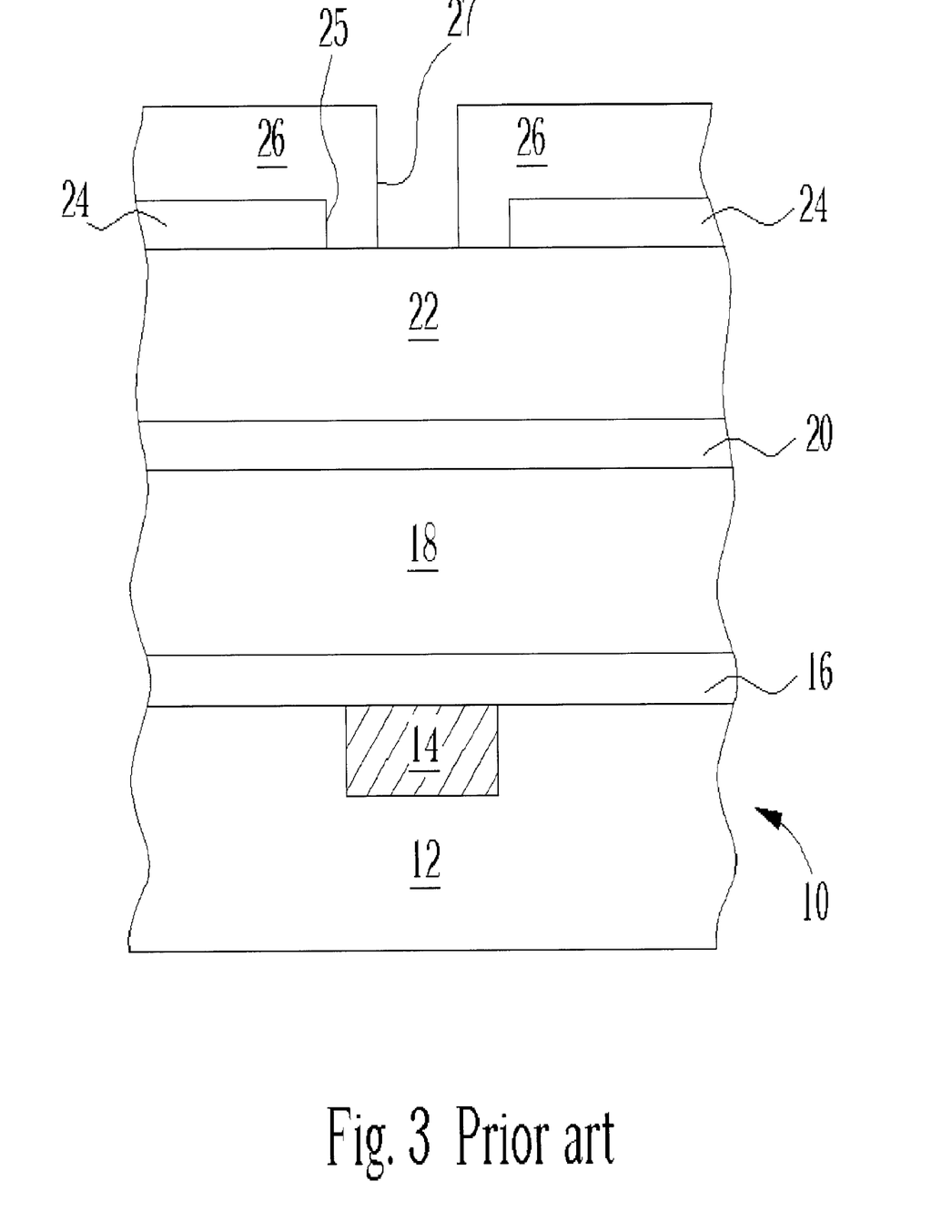

As shown in FIG. 2, after the stacked structure shown in FIG. 1 is formed, a photolithographic and etching process is performed to form an opening 25 in the hard mask layer 24 until reaching a top surface of the low-k layer 22. The opening 25 defines a pattern for forming a trench of the dual damascene structure. Following this, as shown in FIG. 3, a photo resist layer 26 is coated on the surface of the semiconductor wafer 10. Another photolithographic process is performed to form an opening 27 penetrating through the photo resist layer 26 down to the top surface of the low-k layer 22. The opening 27 functions to define a pattern for forming a via hole of the dual damascene structure, so a width of the opening 27 must be smaller than that of the opening 25. In addition, the opening 27 is disposed inside the opening 25, such that a self-aligned contact (SAC) etching process is used thereafter to form the dual damascene structure.

Figure 4:
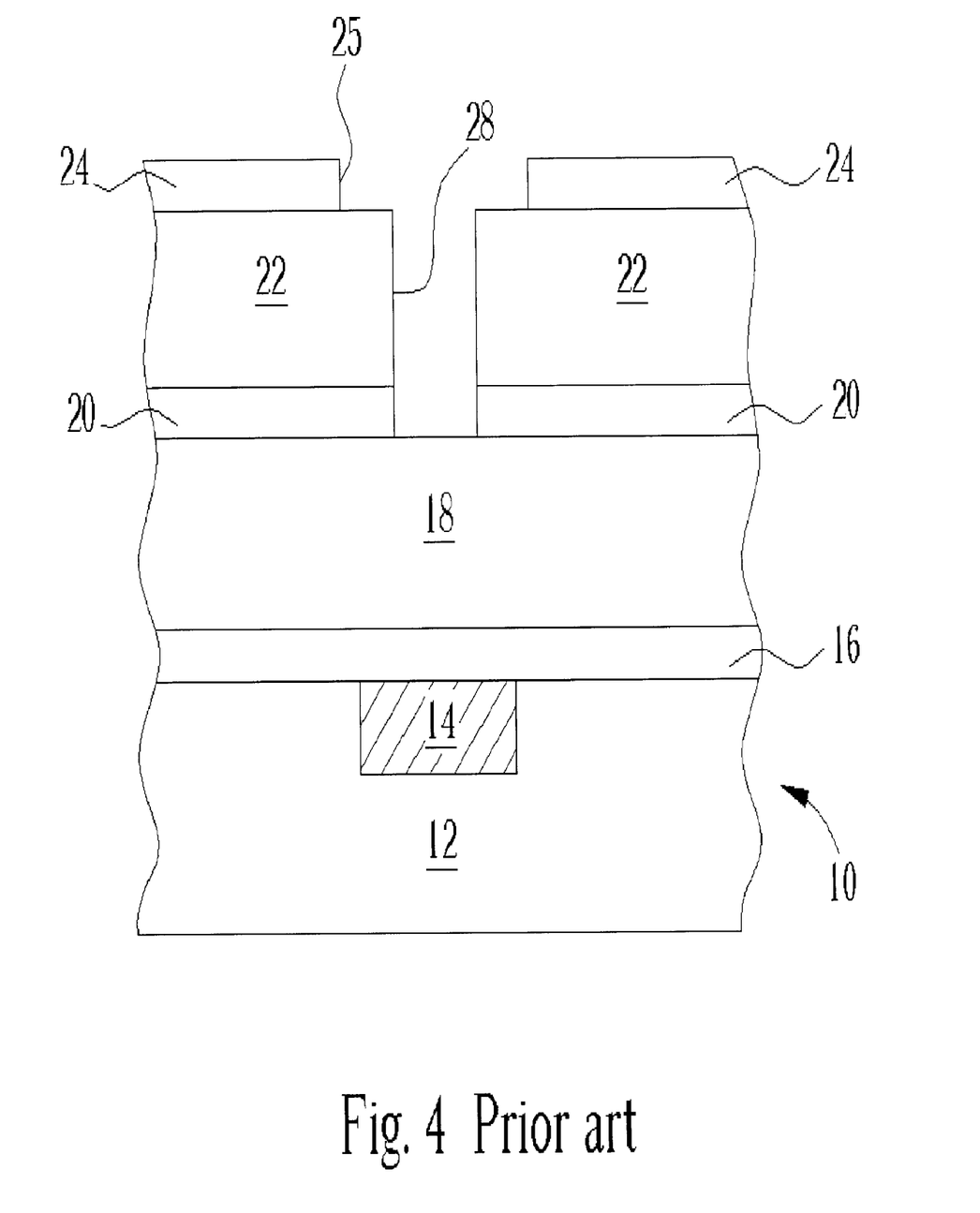

As shown in FIG. 4, a first etching process, such as an anisotropic dry etching process, is performed along the opening 27 to remove portions of the low-k layer 22 and the passivation layer 20 not covered by the photo resist layer 26, forming an opening 28 until reaching a top surface of the low-k layer 18. Thereafter, a resist stripping process is performed to completely remove the photo resist layer 26.

Figure 5:
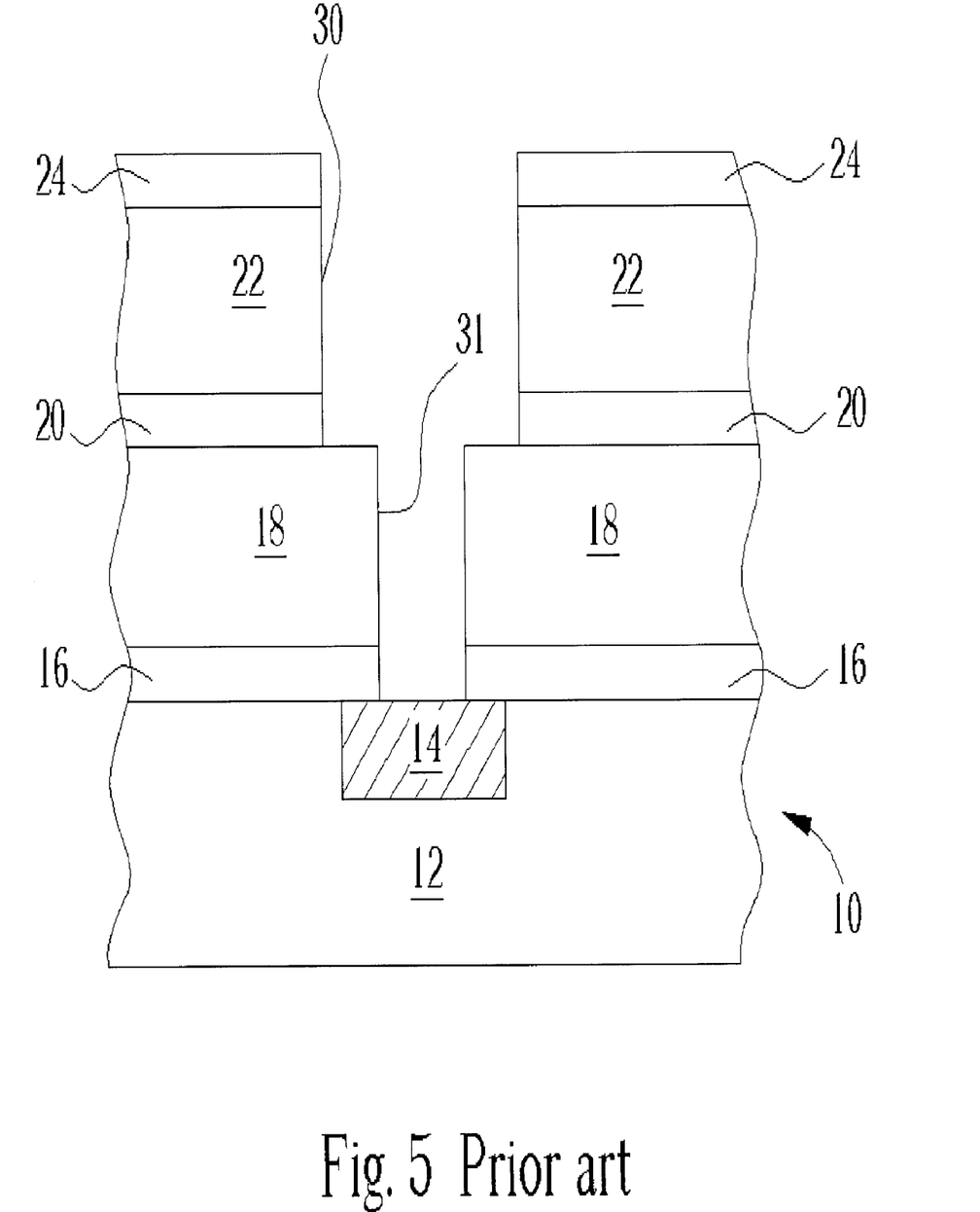

As shown in FIG. 5, a second etching process is performed by utilizing the passivation layers 20 and 16 as stop layers to simultaneously remove portions of the low-k layers 22 and 18 not covered by the hard mask layer 24. Following this, both the passivation layer 20 and the passivation layer 16 not covered by the hard mask layer 24 are removed. As a result, a trench 30 penetrating through the low-k layer 22 and the passivation layer 20, and a via hole 31 penetrating through the low-k layer 18 and the passivation layer 16 down to a top surface of the conducting layer 14 are simultaneously formed.

Figure 6:
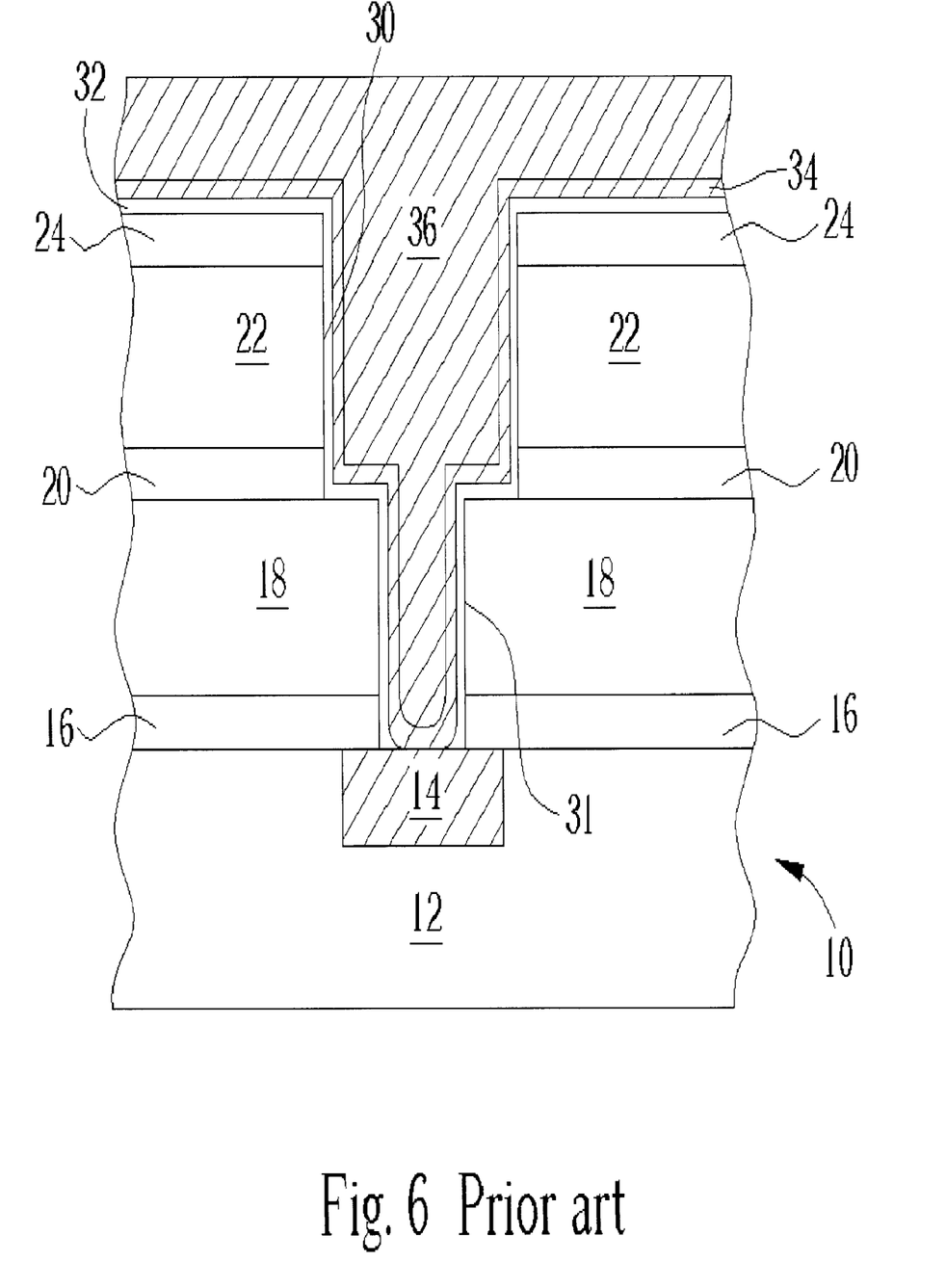

As shown in FIG. 6, a deposition process is then performed to form a barrier layer 32 on the semiconductor wafer 10. The barrier layer 32 is formed of silicon nitride to prevent diffusion of copper or tungsten from various conductive layers into silicon. Alternatively, the barrier layer 32 can also be composed of composite materials such as silicon nitride/Ta/Ti/TiN to increase adhesion between the dual damascene structure and a metal layer covering the dual damascene structure. Following that, a re-sputtering process is performed to remove portions of the barrier layer 32 to expose the top surface of the conducting layer 14. A physical vapor deposition (PVD) process is thereafter performed to form a Cu seed layer 34 on the surface of the semiconductor wafer 10. The Cu seed layer 34 covers the exposed conducting layer 14 and the barrier layer 32. The objective for forming the Cu seed layer 34 is not only to provide a conductive path, but is also to provide a nucleation layer to allow the electric plating copper to nucleate and grow on it later. After that, an electric copper plating (ECP) process is performed to form a metal layer 36 on a surface of the Cu seed layer 34 to fill up both the trench 30 and the via hole 31.

Figure 7:
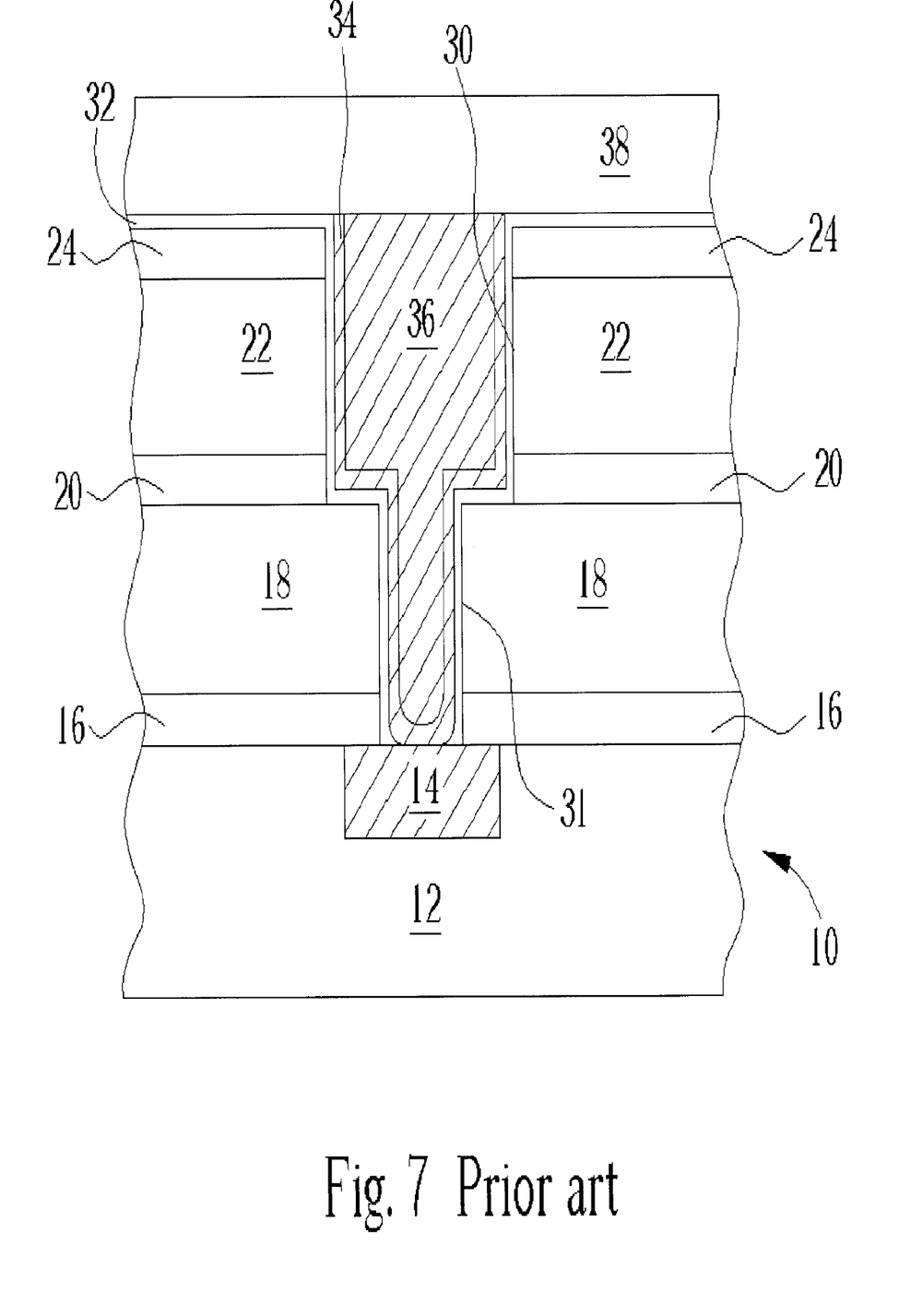

As shown in FIG. 7, a chemical mechanical polishing process is performed by utilizing the barrier layer 32 as an end-point to remove the metal layer 36 and the Cu seed layer 34 disposed outside the trench 30 and the via hole 31, such that the remaining metal layer 36 inside the trench 30 and the via hole 31 is aligned with the surface of the barrier layer 32 disposed outside the trench 30. Finally, a passivation layer 38, such as a silicon nitride layer, is formed on the surface of the semiconductor wafer 10 to complete the fabrication of the dual damascene copper wire.

With regarding to the physical characteristics of the low-k material and the low resistivity cupper wire, these two materials go together perfectly to effectively improve the RC delay caused by signal transmission between wires when the device size is shrunk. However, such a perfect combination faces a bottleneck. Since the Cu seed layer 34 is formed by a physical vapor deposition process, and the thin film formed by the physical vapor deposition process is characterized in poor step coverage, an overhang phenomenon thus occurs to result in a discontinuous and not uniform Cu seed layer 34.

Figure 8:
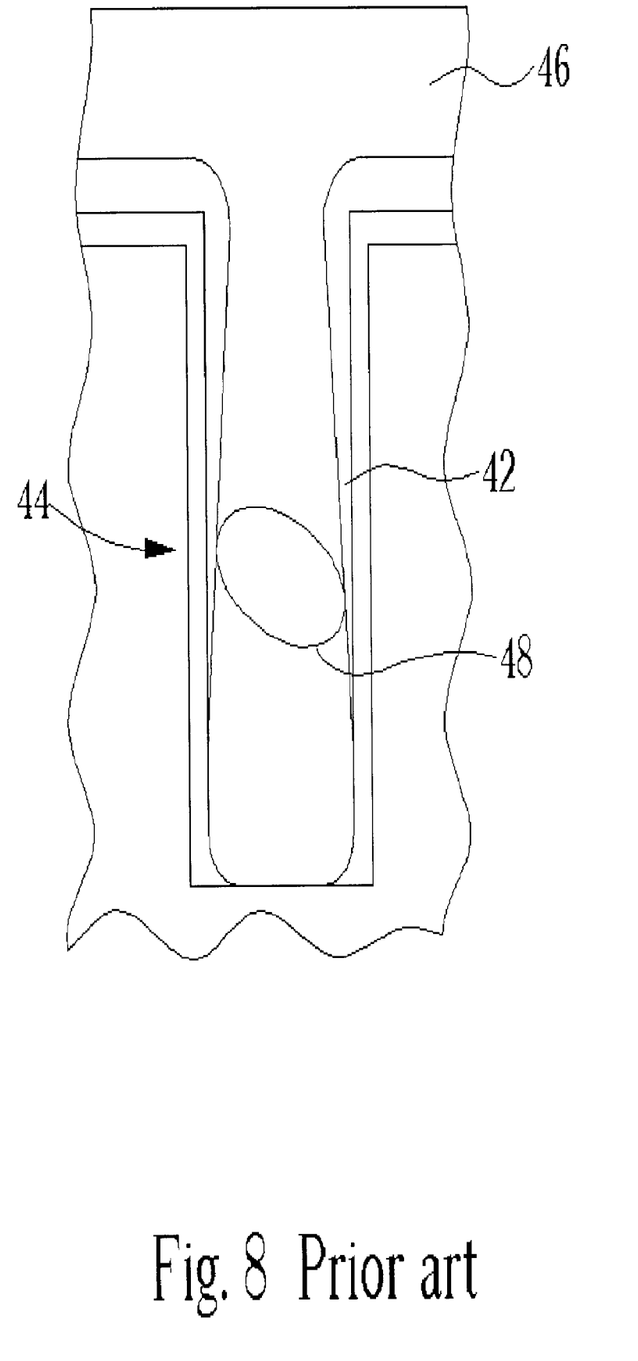
FIG. 8 is a schematic diagram illustrating defects produced in a dual damascene copper wire according to the prior art.

As a result, voids are produced in the metal layer 36 when the metal layer 36 is filled into the dual damascene structure subsequently, leading to the poor Cu gap-filling problem. Due to the poor adhesion force between the Cu seed layer 34 and the barrier layer 32, peeling phenomenon occurs in the metal layer 36 during the subsequent chemical mechanical polishing process to decrease the yield of the dual damascene copper wire greatly. Please refer to FIG. 8. FIG. 8 is a schematic diagram illustrating defects produced in a dual damascene copper wire according to the prior art. As shown in FIG. 8, the overhang phenomenon of the Cu seed layer 42 tends to occur at an open of the via hole 44, and the discontinuous phenomenon of the Cu seed layer 42 tends to occur at a bottom of the via hole 44. Therefore, the Cu seed layer 42 at the lower layer and the bottom layer grows slowly such that the bottom up filling behavior is not able to dominate the filling mechanism during the electric copper plating process. As a result, voids 48 are produced in the metal layer 46 after the electric copper plating process.

Therefore, it is very important to develop a new method of forming a dual damascene copper wire to fill in the copper conductive layer into the dual damascene structure, having a small line width and a high aspect ratio, successfully without increasing the complexity of processing. In addition, this method should form the dual damascene copper wire having a low resistivity, a low surface roughness, and a superior adhesion.

SUMMARY OF INVENTION

It is therefore a primary objective of the present invention to provide a method of forming a dual damascene copper wire to resolve the above-mentioned problems.

According to the claimed invention, at least one wire is formed on a substrate. The substrate comprises at least one conductive region. An insulating layer is disposed on the substrate, and the insulating layer includes at least one recess exposing the conductive region. The method includes forming a barrier layer on a surface of the insulating layer and the recess, forming a continuous and uniform conductive layer on a surface of the barrier layer, forming a seed layer on a surface of the conductive layer, and forming a metal layer on a surface of the seed layer, and the metal layer filling up the recess.

Since the present invention method of forming the dual damascene copper wire is to form the conductive layer, having good conductivity and good step coverage ability, underneath the Cu seed layer first, the thickness of the Cu seed layer is thus reduced to improve the overhang phenomenon of the Cu seed layer. Therefore, the continuity and uniformity of the Cu seed layer, and the adhesion between the Cu seed layer and the barrier layer are improved. Furthermore, because the conductive layer has superior continuity, uniformity, and current conductive ability, the overall conductivity uniformity is effectively improved to distribute the current evenly during the subsequent electric copper plating process. As a result, the Cu gap-filling ability is improved. Since the current conductivity on the conductive layer is very uniform, the process window of the subsequent electric copper plating process is obviously enlarged. When the Cu seed layer is an alloy layer, the metal atoms rather than the copper atoms will be absorbed via the grain boundaries to inhibit the diffusion of the copper atoms along the grain boundaries, leading to a greatly improved reliability performance.

These and other objectives of the present invention will no doubt become obvious to those of ordinary skill in the art after reading the following detailed description of the preferred embodiment that is illustrated in the various figures and drawings.

DETAILED DESCRIPTION

Figure 9:
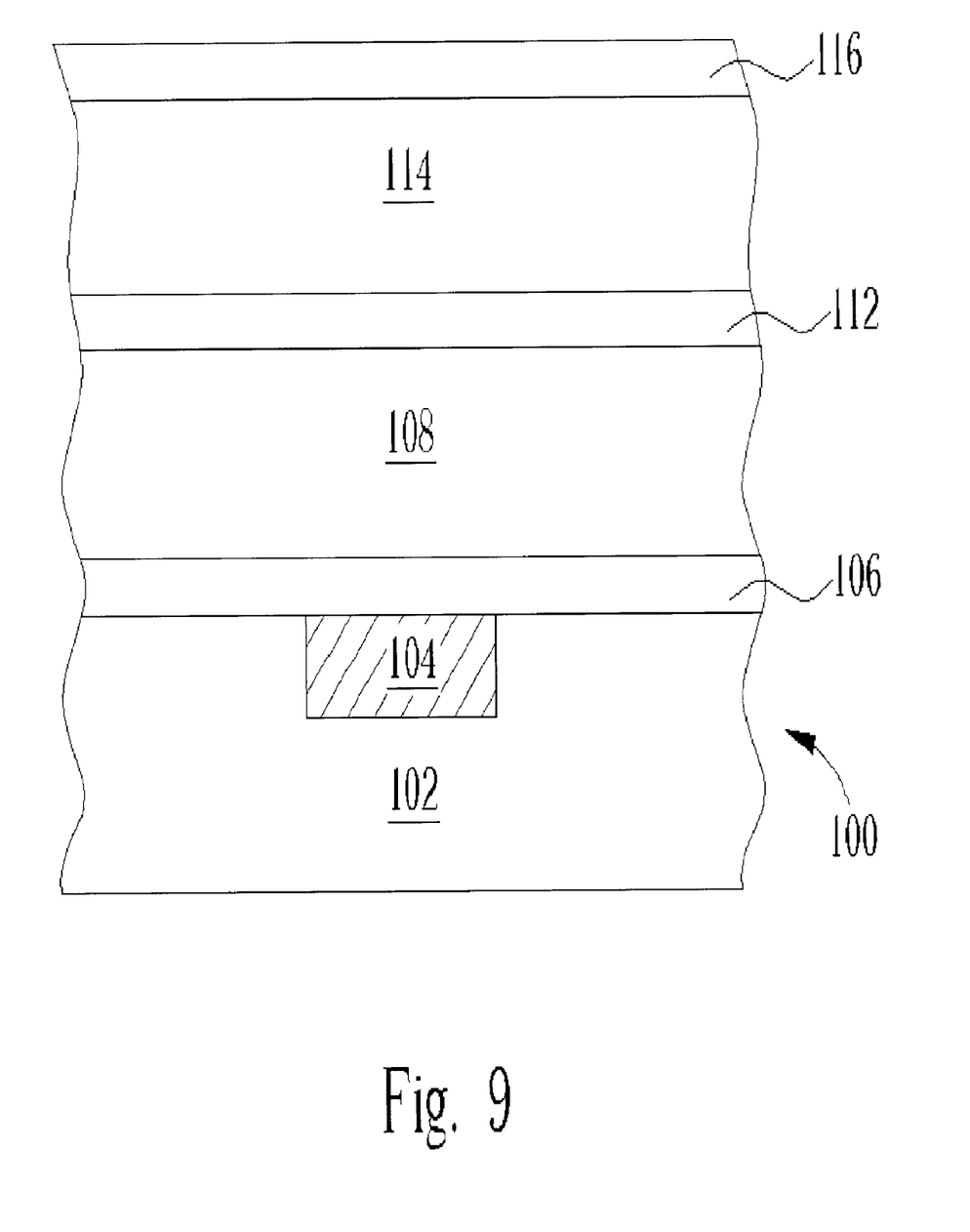
FIG. 9 to FIG. 15 are schematic diagrams of a present invention method of fabricating a dual damascene copper wire.

Please refer to FIG. 9 to FIG. 15. FIG. 9 to FIG. 15 are schematic diagrams of a present invention method of fabricating a dual damascene copper wire. As shown in FIG. 9, a semiconductor wafer 100 comprises a substrate 102, a conducting layer 104 disposed on a predetermined region of a surface of the substrate 102, and a passivation layer 106 disposed on a surface of the conducting layer 104. Since the other elements disposed on the surface of the substrate 102 are not the concerning parts in the dual damascene process, they are not shown in FIG. 9 to FIG. 15. Furthermore, the semiconductor wafer 100 comprises a low-k layer 108, a passivation layer 112, a low-k layer 114, and a hard mask layer 116 sequentially disposed on a surface of the passivation layer 106. The passivation layer 106, usually composed of silicon nitride, is used as an etch stop layer to avoid the materials underneath the via hole from being damaged when etching down to a bottom of the via hole due to over etch.

The low-k layers 108 and 114 are normally formed of spin-on-coating low-k materials, such as HSQ or FLARE™. In addition, the low-k layers 108 and 114 may be formed by a chemical vapor deposition (CVD) process. Since many of the low-k materials (especially the organic low-k materials) are fragile, denser materials, such as silicon nitride, are chosen to form the passivation layer 112 on the low-k layer 108 to harden the low-k layer 108. Similarly, another passivation layer is required to cover the low-k layer 114. The hard mask layer 116 covering the low-k layer 114 functions not only as the passivation layer but also as a hard mask in subsequent etching processes. The hard mask layer 116 is composed of silicon nitride or silicon oxy-nitride.

Figure 10:
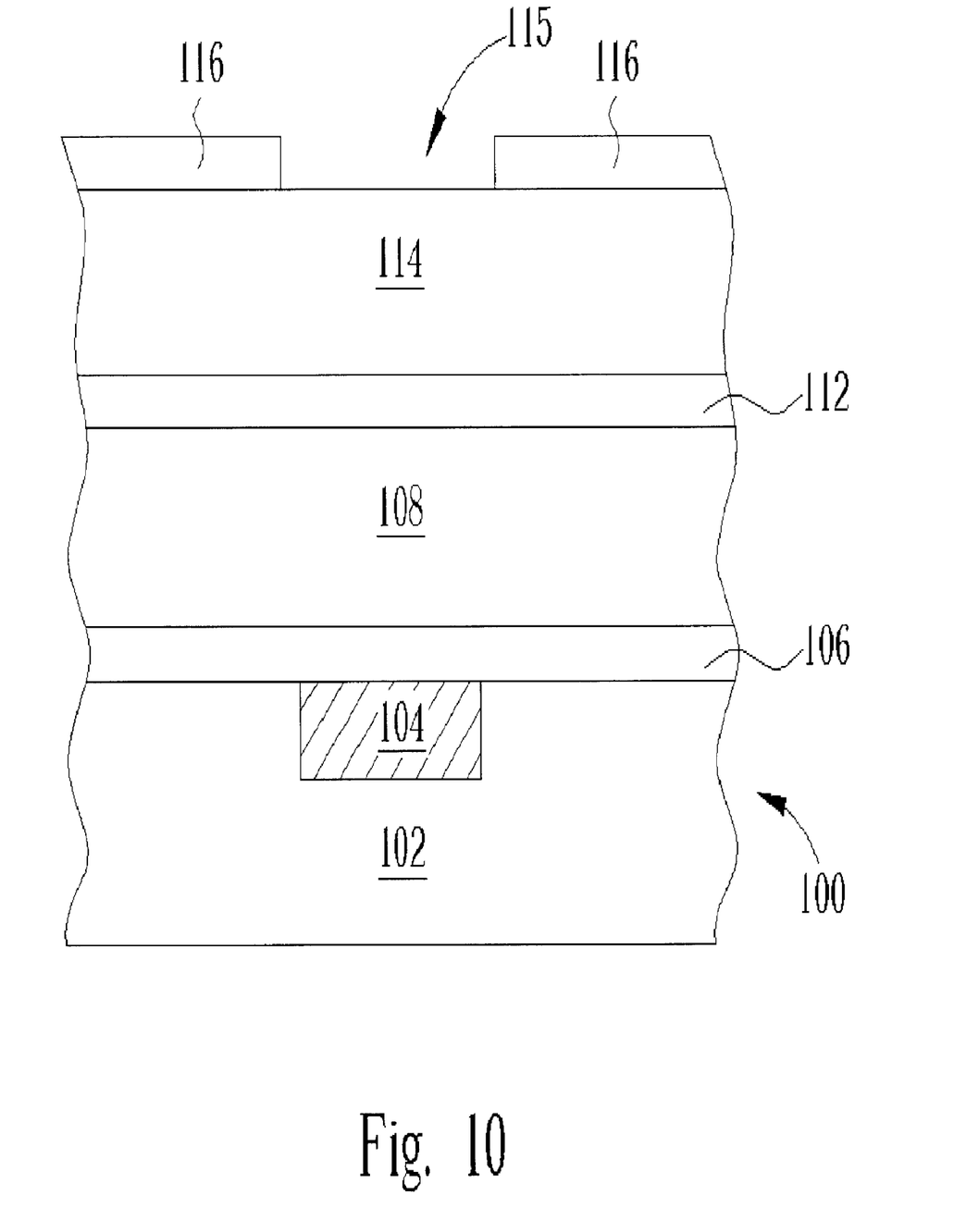
Figure 11:
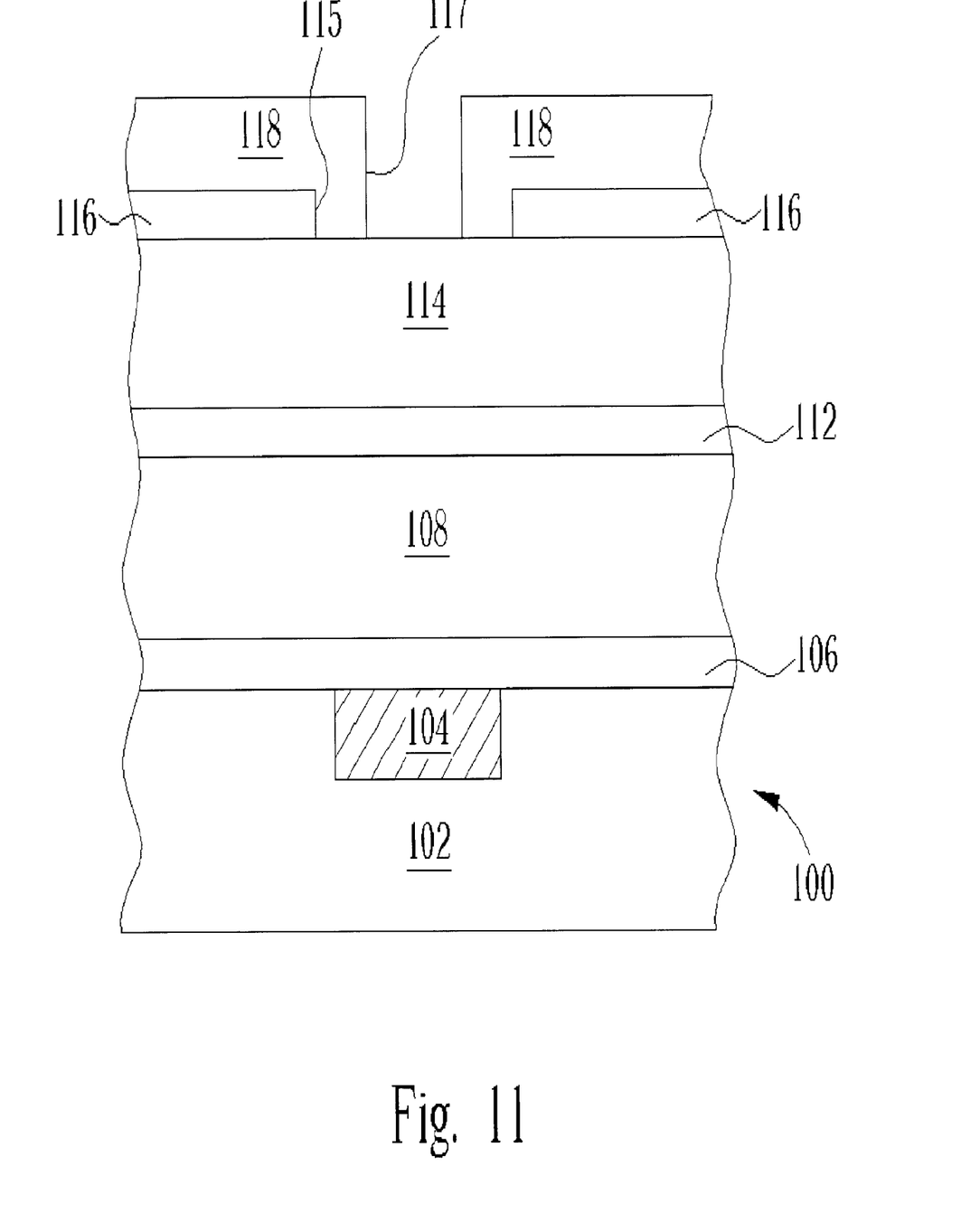

As shown in FIG. 10, after the stacked structure shown in FIG. 9 is formed, a photolithographic and etching process is performed to form an opening 115 in the hard mask layer 116 until reaching a top surface of the low-k layer 114. The opening 115 defines a pattern for forming a trench of the dual damascene structure. Following this, as shown in FIG. 11, a photo resist layer 118 is coated on the surface of the semiconductor wafer 100. Another photolithographic process is performed to form an opening 117 penetrating through the photo resist layer 118 down to the top surface of the low-k layer 114. The opening 117 functions to define a pattern for forming a via hole of the dual damascene structure, so a width of the opening 117 must be smaller than that of the opening 115. In addition, the opening 117 is disposed inside the opening 115, such that a self-aligned contact etching process is used thereafter to form the dual damascene structure.

Figure 12:
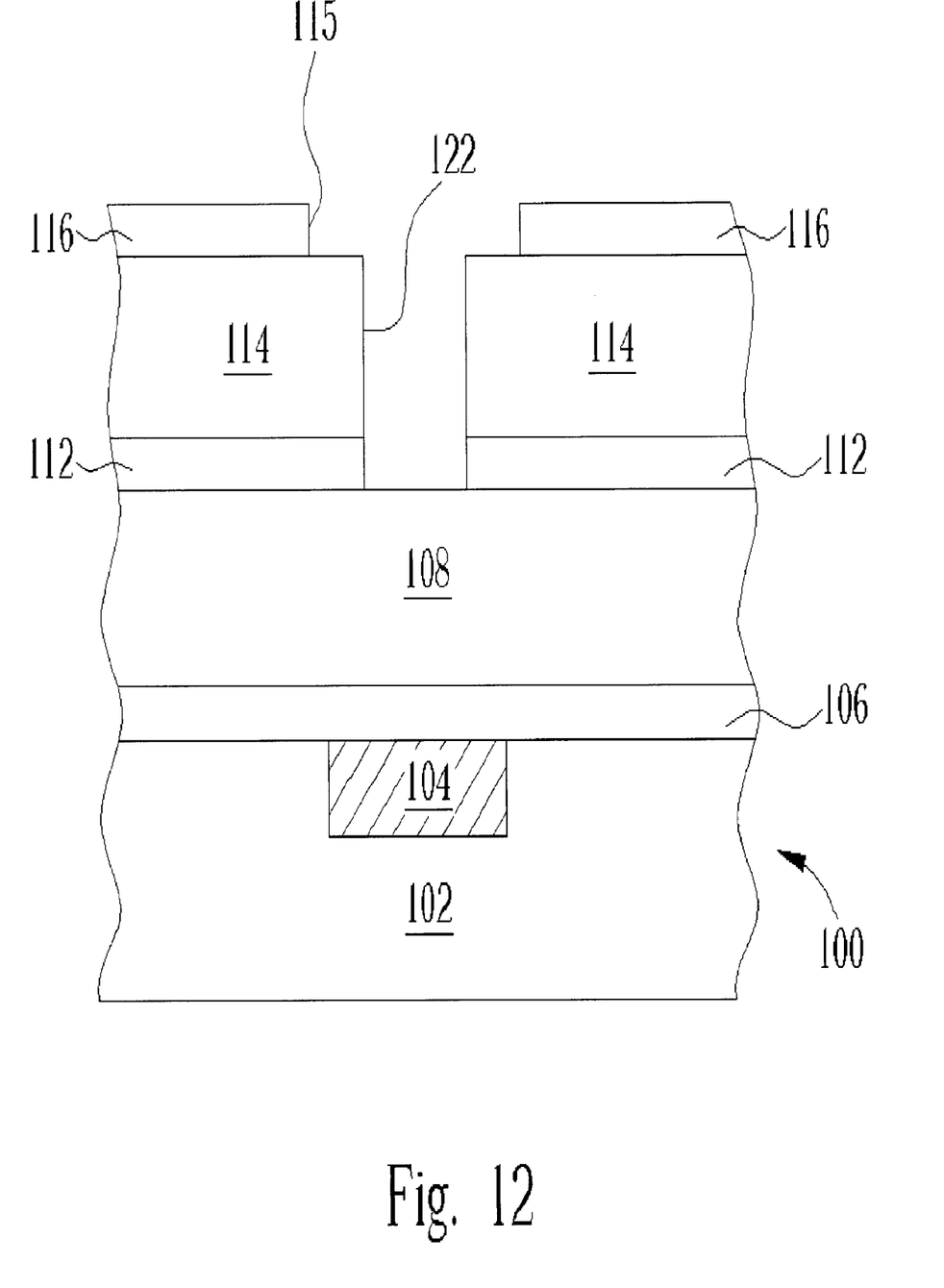

As shown in FIG. 12, a first etching process, such as an anisotropic dry etching process, is performed along the opening 117 to remove portions of the low-k layer 114 and the passivation layer 112 not covered by the photo resist layer 118, forming an opening 122 until reaching a top surface of the low-k layer 108. Thereafter, a resist stripping process is performed to completely remove the photo resist layer 118.

Figure 13:
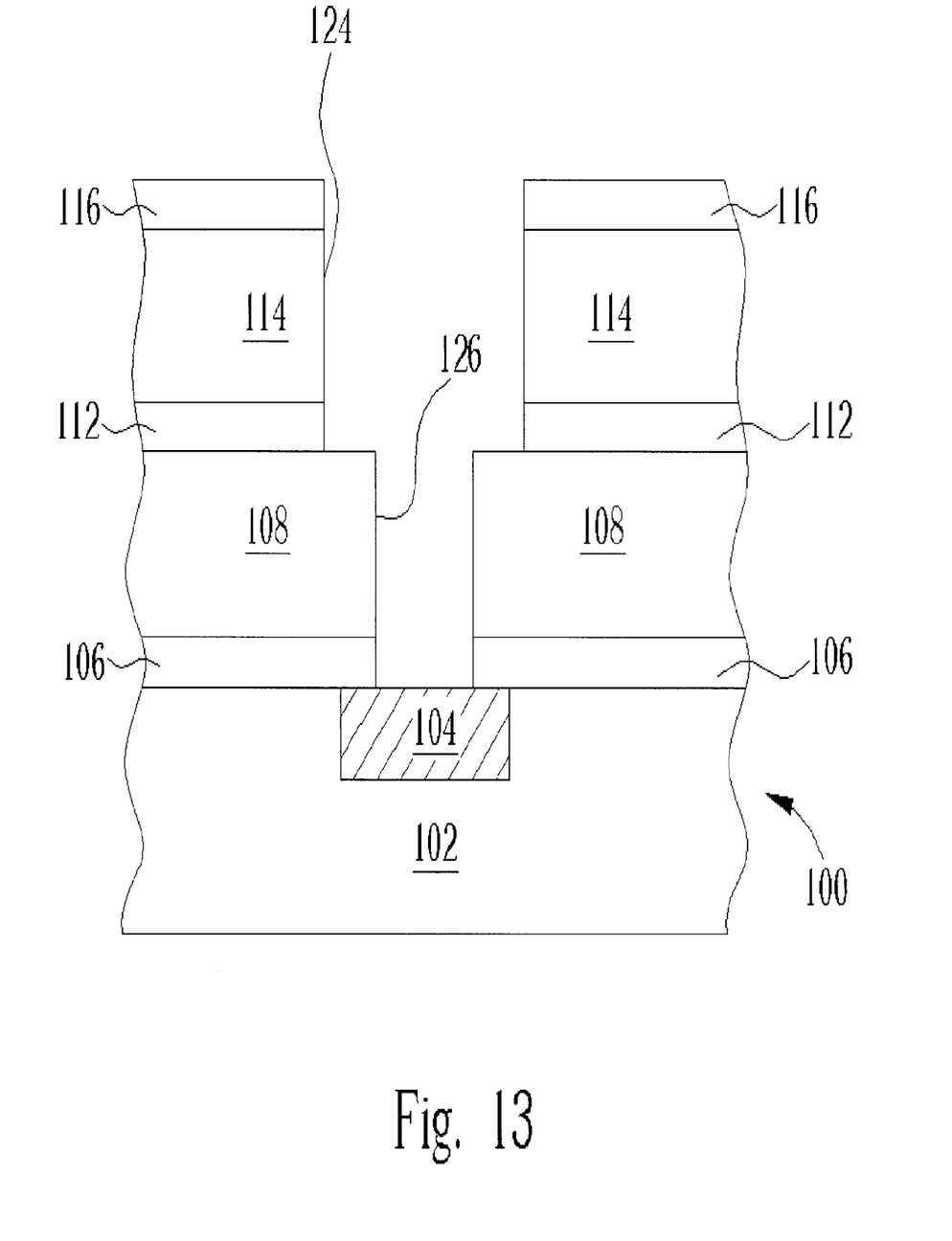

As shown in FIG. 13, a second etching process is performed by utilizing the passivation layers 112 and 106 as stop layers to simultaneously remove portions of the low-k layers 114 and 108 not covered by the hard mask layer 116. Following this, both the passivation layer 112 and the passivation layer 106 not covered by the hard mask layer 116 are removed. As a result, a trench 124 penetrating through the low-k layer 114 and the passivation layer 112, and a via hole 126 penetrating through the low-k layer 108 and the passivation layer 106 down to a top surface of the conducting layer 104 are simultaneously formed. In fact, the passivation layer 112 is also used as an etching stop layer to control the accuracy and uniformity of the thickness of the trench 124. When this etching stop layer is not disposed in the dual damascene structure, the non-uniformity of the dry etching process, the microloading effect, and the aspect ratio dependence etching (ARDE) effect tends to result in uncontrollable trench 124 thickness and trench 124 thickness uniformity.

Figure 14:
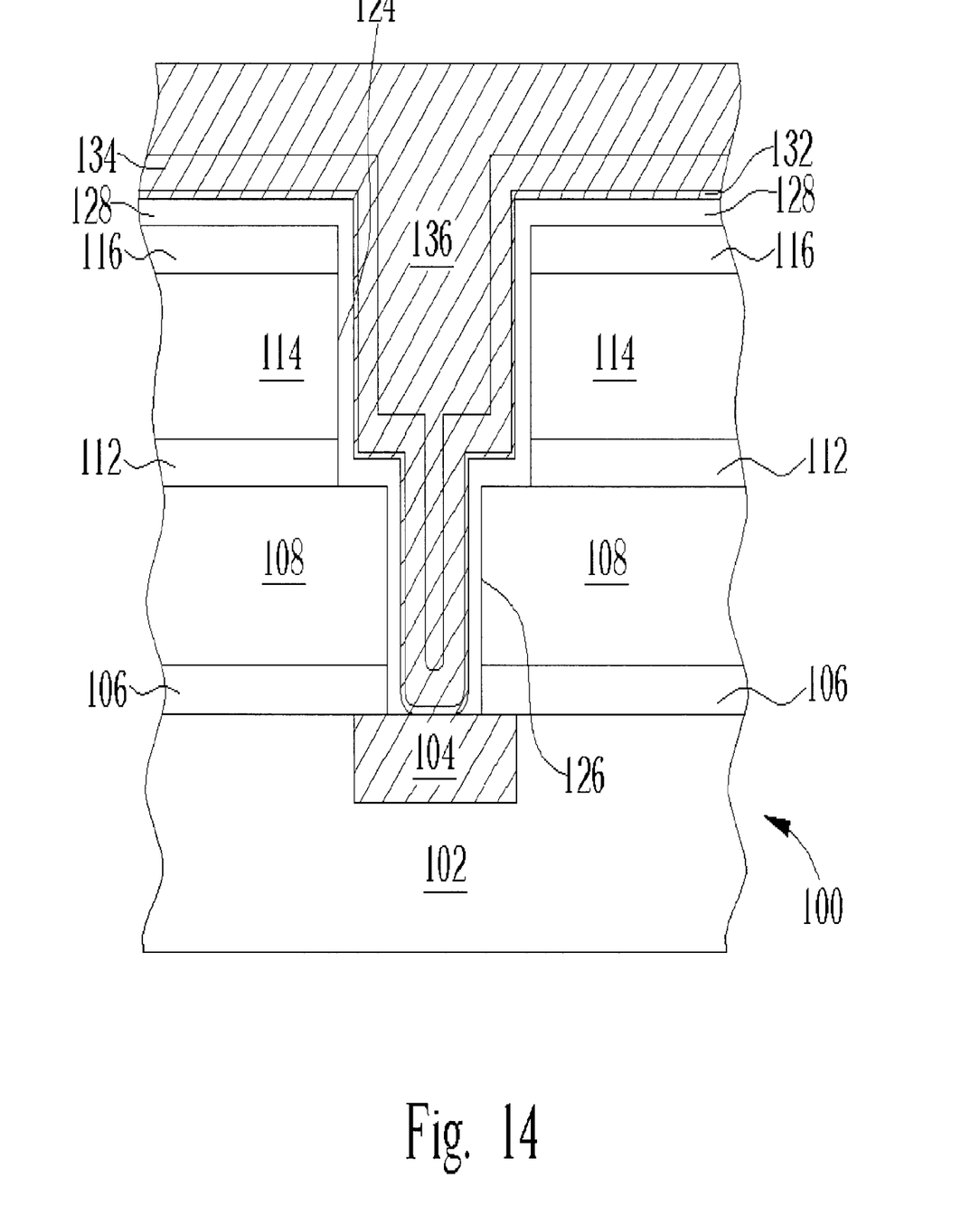

As shown in FIG. 14, a deposition process is then performed to form a barrier layer 128 on the semiconductor wafer 100. The barrier layer 128 is used for preventing diffusion of copper or tungsten from various conductive layers into silicon. The barrier layer 128 may be a silicon nitride layer, a titanium nitride layer (TiN layer), a tantalum nitride layer (TaN layer), or a tantalum nitride/tantalum (TaN/Ta) composite metal layer. The barrier layer 128 is also used to increase adhesion between the dual damascene structure and a metal layer covering the dual damascene structure. Following that, a re-sputtering process is performed to remove portions of the barrier layer 128 to expose the top surface of the conducting layer 104.

A chemical vapor deposition (CVD) process or an atomic layer deposition (ALD) process is thereafter performed to form a continuous and uniform conductive layer 132 on a surface of the barrier layer 128 to cover the exposed conducting layer 104. The conductive layer 132 is usually an aluminum layer (Al layer) or a tungsten layer (W layer), and a thickness of the conductive layer 132 ranges from 5 to 400 angstroms (A). Actually, any thin film, formed below 400° C., having good conductivity and step coverage ability, and having good adhesion to the barrier layer 128 can be used as the conductive layer 132.

After that, a physical vapor deposition process is performed to form a Cu seed layer 134 on the surface of the semiconductor wafer 100. A thickness of the seed layer 134 ranges from 5 to 2000 angstroms, and the Cu seed layer 134 covers the conductive layer 132. The Cu seed layer 134 is composed of copper or copper alloy. The objective for forming the Cu seed layer 134 is not only to provide a conductive path, but is also to provide a nucleation layer to allow the electric plating copper to nucleate and grow on it later. An electric copper plating process is then performed to form a metal layer 136 on a surface of the Cu seed layer 134 to fill up both the trench 124 and the via hole 126.

Since the conductive layer 132 is formed prior to the Cu seed layer 134, and the conductive layer 132 formed by the chemical vapor deposition process or the atomic layer deposition process has a better step coverage ability, the thickness of the Cu seed layer 134 is decreased correspondingly. Therefore, the overhang phenomenon of the Cu seed layer 134 formed by the physical vapor deposition process is improved to improve the continuity and uniformity of the Cu seed layer 134, and to improve the adhesion to the barrier layer 128. In addition, because the conductive layer 132 has a very superior uniformity in current conductivity, the overall conductivity uniformity is obviously improved to distribute the current evenly. As a result, the Cu gap-filling ability is improved.

Figure 15:
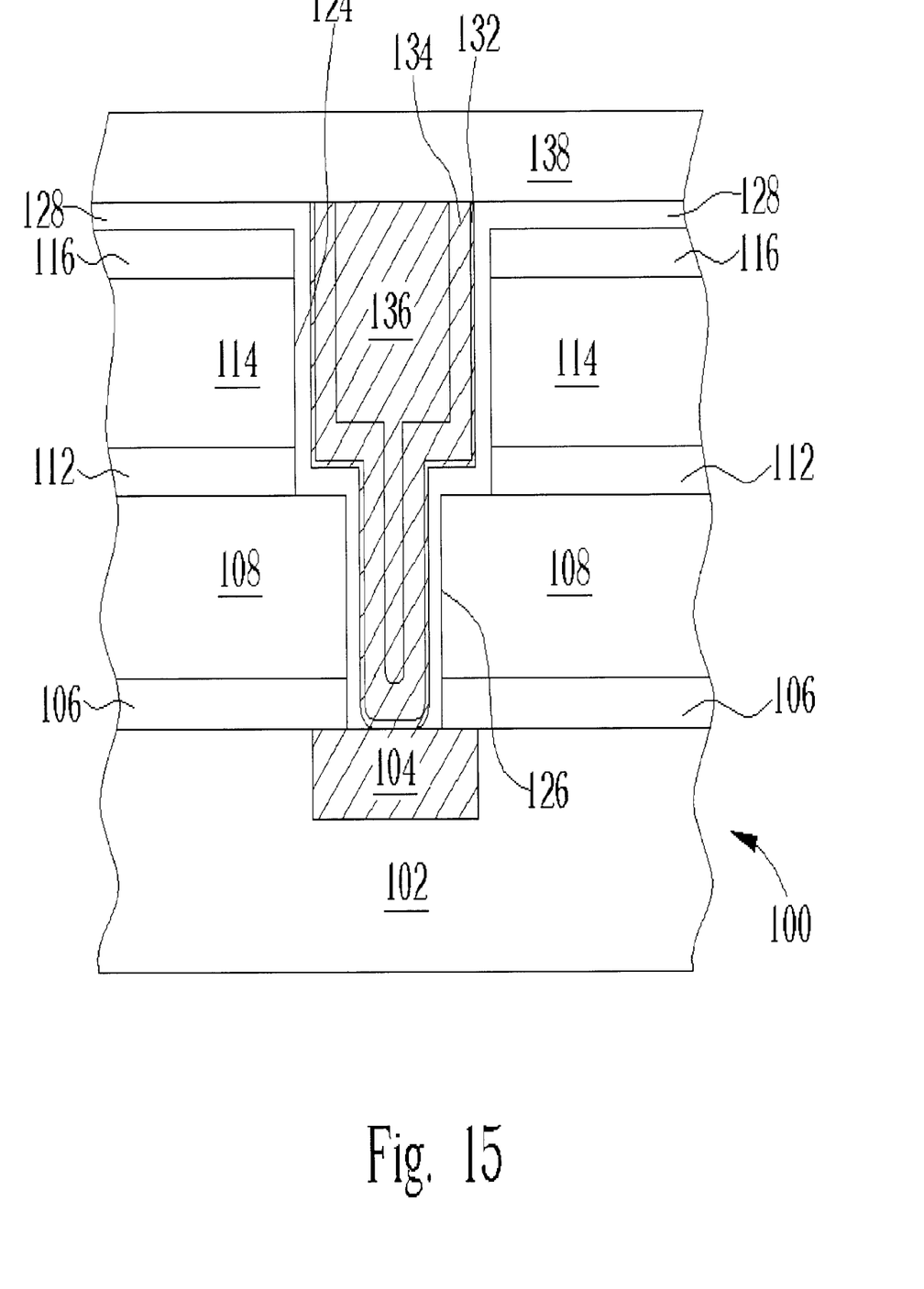

As shown in FIG. 15, a chemical mechanical polishing process is performed by utilizing the barrier layer 128 as an end-point to remove the metal layer 136, the Cu seed layer 134, and the conductive layer 132 disposed outside the trench 124 and the via hole 126, such that the remaining metal layer 136 inside the trench 124 and the via hole 126 is aligned with the surface of the barrier layer 128 disposed outside the trench 124. Finally, a passivation layer 138, such as a silicon nitride layer, is formed on the surface of the semiconductor wafer 100 to complete the fabrication of the dual damascene copper wire.

It is worth noticing that the conducting layer 104 is not limited to the shape and site shown in FIG. 9 to FIG. 15. Since the conducting layer 104 may be a source of a transistor, a gate of a transistor, a drain of a transistor, a lower level wire, a landing pad, or a resistor, its shape and site may change correspondingly. Furthermore, the present invention method is not only applied to a trench first dual damascene process shown in FIGS. 9 to 15, but is also applied to a via first dual damascene process. The via first dual damascene process etches the copper plug pattern first, and then etches the copper wire pattern. The other portions of the via first dual damascene process is quite the same as the preferred embodiment of the present invention. The present invention method may also be applied to a self-aligned dual damascene process. The self-aligned dual damascene process is to form a hard mask layer composed of silicon nitride in the inter layer dielectric layer (ILD layer), and to etch a pattern required by forming the via hole in the hard mask layer. The other portions of the self-aligned dual damascene process is quite the same as the trench first dual damascene process and the via first dual damascene process. Moreover, the present invention method may be applied to a silicon-on-insulator substrate (SOI substrate).

Since the present invention method of forming the dual damascene cooper wire is to form the conductive layer, having good conductivity and good step coverage ability, underneath the Cu seed layer first, the thickness of the Cu seed layer is reduced and the overhang phenomenon of the Cu seed layer is improved. Therefore, the continuity and uniformity of the Cu seed layer, and the adhesion between the Cu seed layer and the barrier layer are improved. In addition, because the conductive layer has superior continuity, uniformity, and current conductive ability, the overall conductivity uniformity is effectively improved to distribute the current evenly during the subsequent electric copper plating process. As a result, the Cu gap-filling ability is improved. When applying the present invention method to a practical production line, the Cu gap-filling ability to the dual damascene structure having a small line width and a high aspect ratio is improved to fabricate the dual damascene copper wire having low resistivity, low surface roughness, and superior adhesion ability.

In contrast to the prior art method, the present invention method of forming the dual damascene copper wire is to form the conductive layer, having good conductivity and good step coverage ability, underneath the Cu seed layer first. The thickness of the Cu seed layer is thus reduced to improve the overhang phenomenon of the Cu seed layer.

Therefore, the continuity and uniformity of the Cu seed layer, and the adhesion between the Cu seed layer and the barrier layer are improved. Furthermore, because the conductive layer has superior continuity, uniformity, and current conductive ability, the overall conductivity uniformity is effectively improved to distribute the current evenly during the subsequent electric copper plating process. As a result, the Cu gap-filling ability is improved. Since the current conductivity on the conductive layer is very uniform, the process window of the subsequent electric copper plating process is obviously enlarged. When the Cu seed layer is an alloy layer, the metal atoms rather than the copper atoms will be absorbed to the grain boundaries to inhibit the diffusion of the copper atoms along the grain boundaries, leading to a greatly improved reliability performance.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming at least one wire on a substrate, the substrate comprising at least one conductive region, an insulating layer disposed on the substrate, and the insulating layer comprising at least one recess exposing the conductive region, the method comprising:

forming a barrier layer on a surface of the insulating layer and the recess;

forming a continuous and uniform conductive layer on a surface of the barrier layer, the conductive layer comprising an aluminum layer;

forming a seed layer on a surface of the conductive layer and interlaying the conductive layer between the seed layer and the barrier layer; and forming a metal layer on a surface of the seed layer, and the metal layer filling up the recess.

2. The method of claim 1 wherein the substrate comprises a semiconductor wafer or a silicon-on-insulator substrate (SOI substrate).

3. The method of claim 1 wherein the conductive region comprises a source of a transistor, a gate of a transistor, a drain of a transistor, a lower level wire, a landing pad, or a resistor.

4. The method of claim 1 wherein the recess is a via hole of a dual damascene structure.

5. The method of claim 1 wherein the barrier layer comprises a silicon nitride layer, a titanium nitride layer (TiN layer), a tantalum nitride layer (TaN layer), or a tantalum nitride/tantalum (TaN/Ta) composite metal layer.

6. The method of claim 1 wherein a thickness of the conductive layer ranges from 5 to 400 angstroms (Å).

7. The method of claim 1 wherein the method for forming the conductive layer comprises a chemical vapor deposition (CVD) process or an atomic layer deposition ALD) process.

8. The method of claim 1 wherein the seed layer is a copper layer formed by a physical vapor deposition (PVD) process.

9. The method of claim 1 wherein the seed layer is a copper alloy layer formed by a physical vapor deposition (PVD) process.

10. The method of claim 1 wherein a thickness of the seed layer ranges from 5 to 2000 angstroms (Å).

11. The method of claim 1 wherein the metal layer is formed by an electric copper plating (ECP) process.

12. A method of forming at least one dual damascene wire on a substrate, the substrate comprising at least one conductive region, an insulating layer disposed on the substrate, and the insulating layer comprising at least one trench pattern and via hole pattern stacked from top to bottom exposing the conductive region, the method comprising:

forming a barrier layer on a surface of the insulating layer, the trench pattern, and the via hole pattern;

forming a continuous and uniform conductive layer on a surface of the barrier layer, the conductive layer comprising an aluminum layer;

forming a seed layer on a surface of the conductive layer and interlaying the conductive layer between the seed layer and the barrier layer; and forming a metal layer on a surface of the seed layer, and the metal layer filling up the trench pattern and the via hole pattern.

13. The method of claim 12 wherein the substrate comprises a semiconductor wafer or a silicon-on-insulator substrate (SOI substrate).

14. The method of claim 12 wherein the conductive region comprises a source of a transistor, a gate of a transistor, a drain of a transistor, a lower level wire, a landing pad, or a resistor.

15. The method of claim 12 wherein the barrier layer comprises a silicon nitride layer, a titanium nitride layer (TiN layer), a tantalum nitride layer (TaN layer), or a tantalum nitride/tantalum (TaN/Ta) composite metal layer.

16. The method of claim 12 wherein the method for forming the conductive layer comprises a chemical vapor deposition (CVD) process or an atomic layer deposition (ALD) process, and a thickness of the conductive layer ranges from 5 to 400 angstroms (Å).

17. The method of claim 12 wherein the seed layer is a copper layer formed by a physical vapor deposition (PVD) process, and a thickness of the seed layer ranges from 5 to 2000 angstroms (Å).

18. The method of claim 12 wherein the seed layer is a copper alloy layer formed by a physical vapor deposition (PVD) process, and a thickness of the seed layer ranges from 5 to 2000 angstroms (Å).

19. The method of claim 12 wherein the metal layer is formed by an electric copper plating (ECP) process.

* * * * *